(12) United States Patent
Yang

(10) Patent No.: US 8,835,996 B2
(45) Date of Patent: Sep. 16, 2014

(54) INTEGRATED CIRCUIT CONFIGURATION HAVING EXTENSION CONDUCTOR STRUCTURE AND FABRICATING METHOD THEREOF

(75) Inventor: Chin-Sheng Yang, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 13/338,353

(22) Filed: Dec. 28, 2011

(65) Prior Publication Data

US 2013/0168742 A1 Jul. 4, 2013

(51) Int. Cl.
*H01L 29/78* (2006.01)

(52) U.S. Cl.
USPC .............. 257/288; 257/382; 257/E29.255

(58) Field of Classification Search
USPC ......................... 257/288, 382–385
See application file for complete search history.

(56) References Cited

U.S. PATENT DOCUMENTS

| | | | |
|---|---|---|---|
| 5,900,735 A | 5/1999 | Yamamoto | |
| 6,378,121 B2 | 4/2002 | Hiraga | |
| 6,477,696 B2 | 11/2002 | Tien | |
| 7,617,475 B2 | 11/2009 | Lin et al. | |
| 2002/0079584 A1 | 6/2002 | Matsunaga | |
| 2003/0205766 A1* | 11/2003 | Kikushima et al. | ........... 257/369 |
| 2008/0042271 A1 | 2/2008 | Dauksher et al. | |
| 2008/0157219 A1* | 7/2008 | Fujiwara et al. | .............. 257/383 |

\* cited by examiner

*Primary Examiner* — Thanh Nguyen

(74) *Attorney, Agent, or Firm* — WPAT, PC; Justin King (57) ABSTRACT

An integrated circuit configuration includes a substrate, a diffusion region, a gate structure, an extension conductor structure, a dielectric layer, a contact structure, and a metal conductor line. The diffusion region is formed in the substrate. The gate structure is formed over the substrate and spanned across the diffusion region. The extension conductor structure is formed over the semiconductor substrate and contacted with the diffusion region. The extension conductor structure is extended externally to a first position along a surface of the substrate, wherein the first position is outside the diffusion region. The dielectric layer is formed over the substrate, the gate structure and the extension conductor structure. The contact structure is penetrated through the dielectric layer to be contacted with the first position of the extension conductor structure. The metal conductor line is formed on the dielectric layer and contacted with the contact structure.

10 Claims, 7 Drawing Sheets

INTEGRATED CIRCUIT CONFIGURATION HAVING EXTENSION CONDUCTOR STRUCTURE AND FABRICATING METHOD THEREOF

FIELD OF THE INVENTION

The present invention relates to an integrated circuit configuration, and more particularly to an integrated circuit configuration with enhanced circuit layout flexibility. The present invention also relates to a fabricating method of the integrated circuit configuration.

BACKGROUND OF THE INVENTION

With great progress of the integrated circuit manufacturing techniques, the device size of the digital logic circuit is developed toward miniaturization. Generally, the digital logic circuit has a plurality of logic gates for collaboratively performing different functions. As the total layout area of the logic gates in the integrated circuit is decreased, the layout area of the digital logic circuit is decreased to achieve the purpose of miniaturization and cost-effectiveness.

Figure 1A:
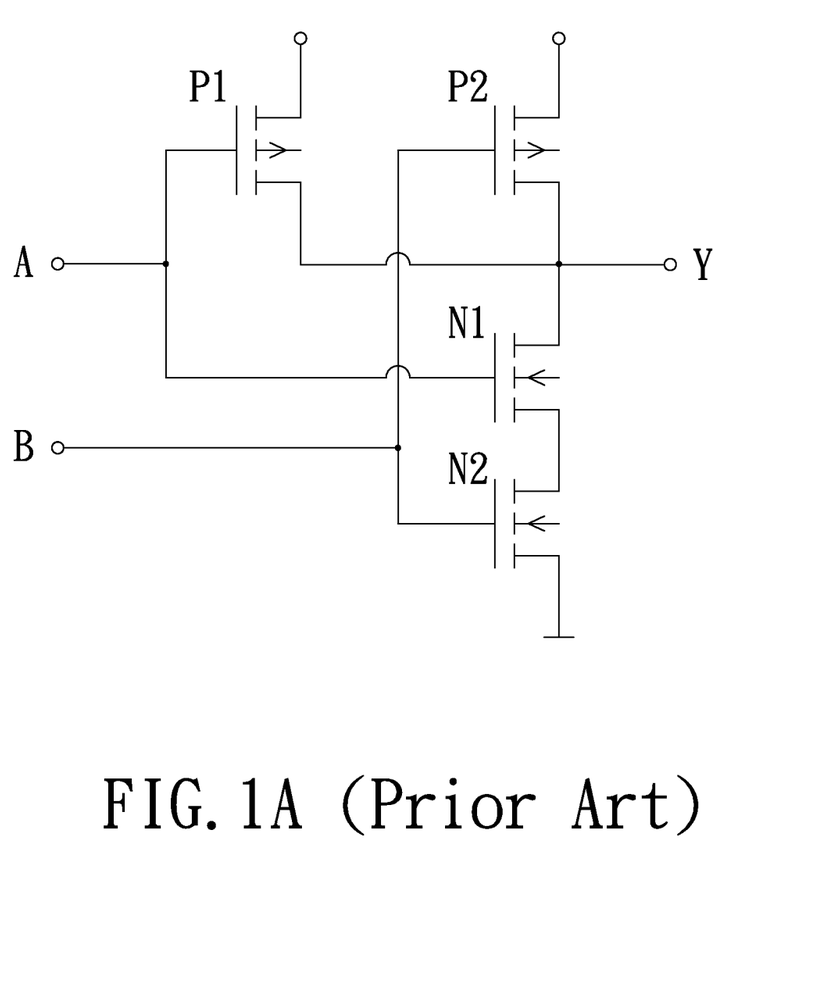
FIG. 1A is a schematic circuit diagram illustrating a NAND gate.

FIG. 1A is a schematic circuit diagram illustrating a NAND gate. The NAND gate is composed of two p-channel metal-oxide-semiconductor transistors P1, P2 and two n-channel metal-oxide-semiconductor transistors N1, N2. In a case that the input terminals A and B are both at the high-level state, the output terminal Y is at the low-level state. Whereas, in a case that at least one of the input terminals A and B is at the low-level state, the output terminal Y is at the high-level state.

The cell library of the NAND gate as shown in FIG. 1A has a corresponding standard cell. Therefore, there is a need of providing an improved integrated circuit configuration with enhanced circuit layout flexibility in order to reduce the device size.

SUMMARY OF THE INVENTION

In accordance with an aspect, the present invention provides an integrated circuit configuration. The integrated circuit configuration includes a substrate, a diffusion region, a gate structure, an extension conductor structure, a dielectric layer, a contact structure, and a metal conductor line. The diffusion region is formed in the substrate. The gate structure is formed over the substrate and spanned across the diffusion region. The extension conductor structure is formed over the semiconductor substrate and contacted with the diffusion region. The extension conductor structure is extended externally to a first position along a surface of the substrate, wherein the first position is outside the diffusion region. The dielectric layer is formed over the substrate, the gate structure and the extension conductor structure. The contact structure is penetrated through the dielectric layer to be contacted with the first position of the extension conductor structure. The metal conductor line is formed on the dielectric layer and contacted with the contact structure.

In an embodiment, the substrate is a semiconductor substrate.

In an embodiment, the diffusion region comprises a channel region, a source region and a drain region, wherein the channel region is located under the gate structure.

In an embodiment, the extension conductor structure is in contact with the source region of the diffusion region.

In an embodiment, the extension conductor structure is in contact with the drain region of the diffusion region.

In an embodiment, the extension conductor structure is a zero-layer metal structure.

In an embodiment, the extension conductor structure includes a slot contact structure and a zero-layer metal structure.

In an embodiment, the contact structure is a zero-layer contact structure.

In an embodiment, the dielectric layer is an inter-metal dielectric layer.

In an embodiment, the metal conductor line is spanned across the gate structure.

In accordance with another aspect, the present invention provides a fabricating method of an integrated circuit configuration. The fabricating method includes the following steps. Firstly, a substrate is provided. Then, a diffusion region is formed in the substrate. Then, a gate structure is formed over the substrate, wherein the gate structure is spanned across the diffusion region. Then, an extension conductor structure is formed over the substrate. The extension conductor structure is in contact with the diffusion region, and extended externally to a first position along a surface of the substrate. The first position is outside the diffusion region. Then, a dielectric layer is formed over the substrate, the gate structure and the extension conductor structure. Then, a contact structure is formed in the dielectric layer, wherein the contact structure is penetrated through the dielectric layer to be contacted with the first position of the extension conductor structure. Afterwards, a metal conductor line is formed on the dielectric layer, wherein the metal conductor line is in contact with the contact structure.

In an embodiment, the substrate is a semiconductor substrate.

In an embodiment, the step of forming the diffusion region includes steps of forming a channel region under the gate structure, and forming a source region and a drain region.

In an embodiment, the extension conductor structure is in contact with the source region of the diffusion region.

In an embodiment, the extension conductor structure is in contact with the drain region of the diffusion region.

In an embodiment, the extension conductor structure is a zero-layer metal structure.

In an embodiment, the step of forming the extension conductor structure includes sub-steps of: forming a slot contact structure, and forming a zero-layer metal structure.

In an embodiment, the contact structure is a zero-layer contact structure.

In an embodiment, the dielectric layer is an inter-metal dielectric layer.

In an embodiment, the metal conductor line is spanned across the gate structure.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1B:
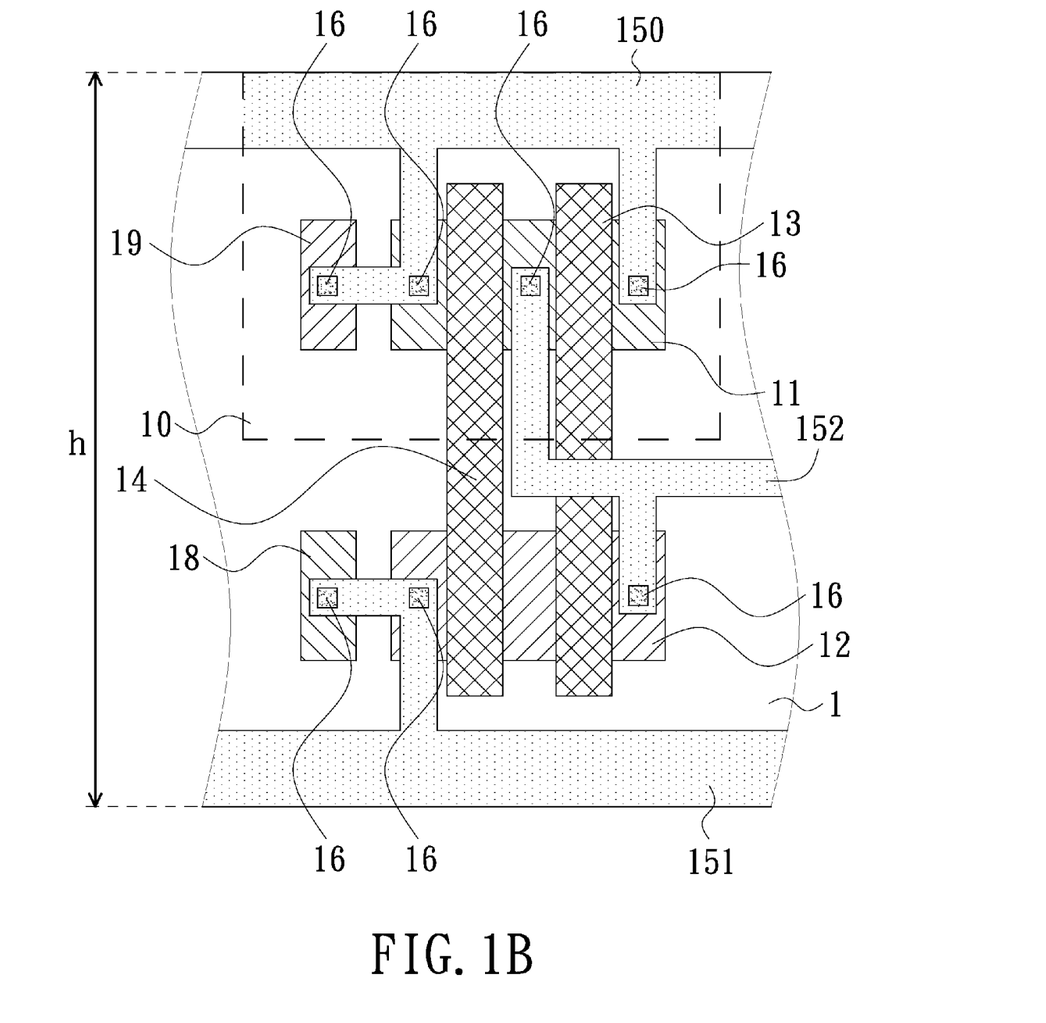
FIG. 1B is a schematic top view illustrating the layout configuration of the NAND gate of FIG. 1A.

FIG. 1B is a schematic top view illustrating the layout configuration of the NAND gate of FIG. 1A. The NAND gate as shown in FIG. 1B was disclosed by the present inventors. The region circumscribed by a dashed line denotes an N-well region 10. The region outside the N-well region 10 denotes a P-type semiconductor substrate 1. A P-type diffusion region 11 and an N-type body contact region 19 are constructed in the N-well region 10. The P-type diffusion region 11 is shared by the p-channel metal-oxide-semiconductor transistors P1 and P2. In addition, an N-type diffusion region 12 and a P-type body contact region 18 are constructed in the P-type semiconductor substrate 1. The N-type diffusion region 12 is shared by the n-channel metal-oxide-semiconductor transistors N1 and N2. Two gate structures 13 and 14 are spanned across the P-type diffusion region 11 and the N-type diffusion region 12 to be respectively served as the input terminals A and B (see FIG. 1A). Moreover, the metal conductor lines 150, 151 and 152 are electrically connected to the P-type diffusion region 11, the N-type body contact region 19, the N-type diffusion region 12 and the P-type body contact region 18 through a plurality of contact pads 16. The metal conductor lines 150, 151 and 152 are also connected to an operating voltage source VDD, a ground terminal and the output terminal Y, respectively. The resulting structure of the NAND gate is shown in FIG. 1B.

As shown in FIG. 1B, the metal conductor line 150 is connected to the source VDD and the metal conductor line 151 is connected to the ground terminal. It is found that the size of the NAND gate is highly dependent on the distance h between the metal conductor line 150 and the metal conductor line 151. Similarly, the size of other logic gate is highly dependent on the distance h.

Figure 2A:
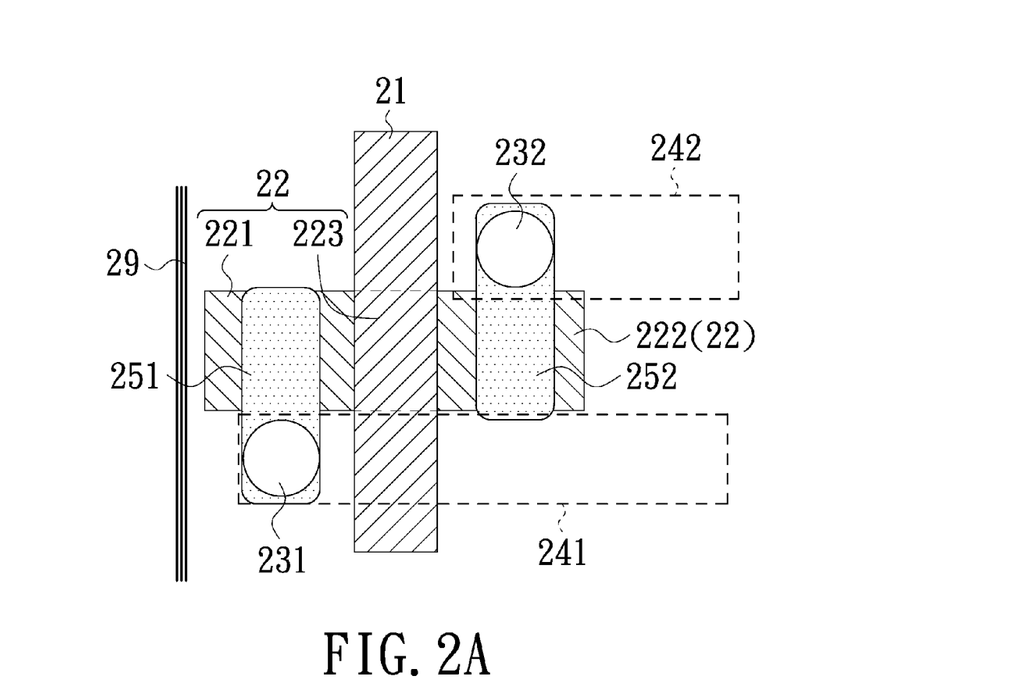
FIGS. 2A~2D are schematic top views illustrating four exemplary integrated circuit configurations with enhanced circuit layout flexibility.

FIGS. 2A~2D are schematic top views illustrating four exemplary integrated circuit configurations with enhanced circuit layout flexibility. FIG. 2A schematically illustrates a first exemplary circuit layout of a metal-oxide-semiconductor transistor. A gate structure 21 is spanned across a diffusion region 22, so that the diffusion region 22 is divided into a source region 221, a drain region 222 and a channel region 223. The channel region 223 is located under the gate structure 21. For enhancing the circuit layout flexibility of the metal-oxide-semiconductor transistor, the contact hole structures 231 and 232 are located at two opposite sides of the diffusion region 22, respectively. Consequently, the layout locations of the metal conductor lines 241 and 242 over the dielectric layer (not shown) are adjustable. Moreover, two extension conductor structures 251 and 252 are located under the dielectric layer (not shown) and respectively connected with the source region 221 and the drain region 222. In this embodiment, the extension conductor structures 251 and 252 are used for changing the distance between the metal conductor lines 241 and 242. Consequently, the metal conductor line 241 is separated from the left-side seal ring 29, and the distance between the metal conductor line 241 and the metal conductor line 242 complies with the designed regulations.

Figure 2B:
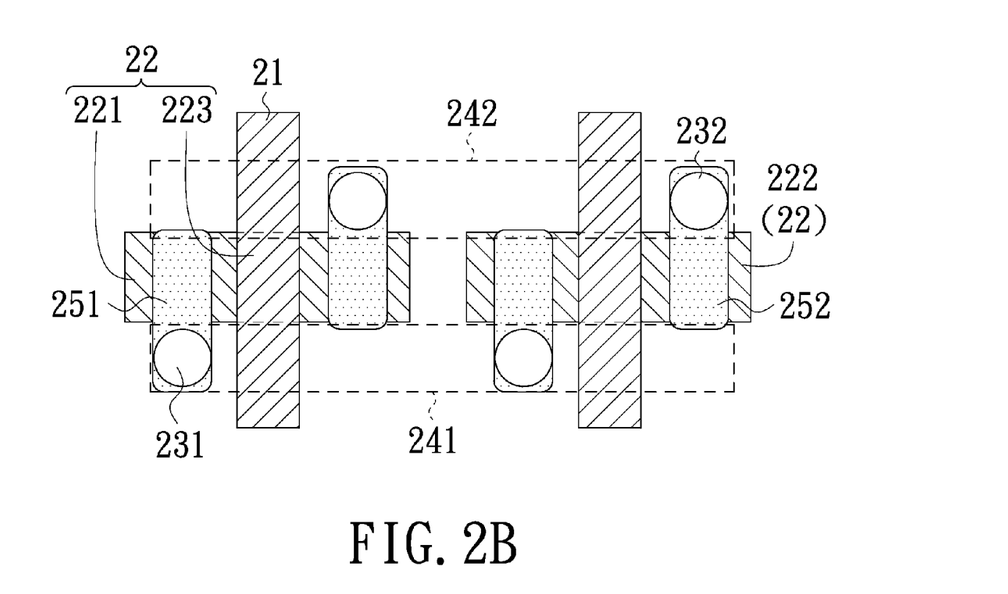

FIG. 2B schematically illustrates a second exemplary circuit layout of two metal-oxide-semiconductor transistors of FIG. 2A. These two metal-oxide-semiconductor transistors are arranged side by side. Similarly, due to the extension conductor structures 251 and 252, the distance between the metal conductor line 241 and the metal conductor line 242 can comply with the designed regulations and facilitate the connection between plural metal-oxide-semiconductor transistors.

Figure 2C:
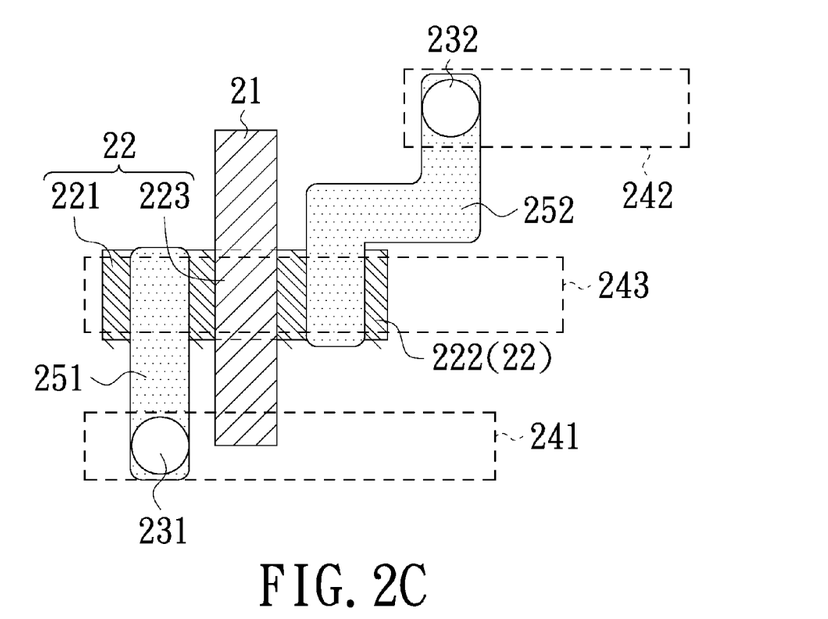

FIG. 2C schematically illustrates a third exemplary circuit layout of another metal-oxide-semiconductor transistor. Similarly, due to the extension conductor structures 251 and 252, the distance between the metal conductor line 241 and the metal conductor line 242 is adjustable. In this embodiment, since the distance between the metal conductor line 241 and the metal conductor line 242 is increased, another metal conductor line 243 may be arranged between the metal conductor line 241 and the metal conductor line 242.

Figure 2D:
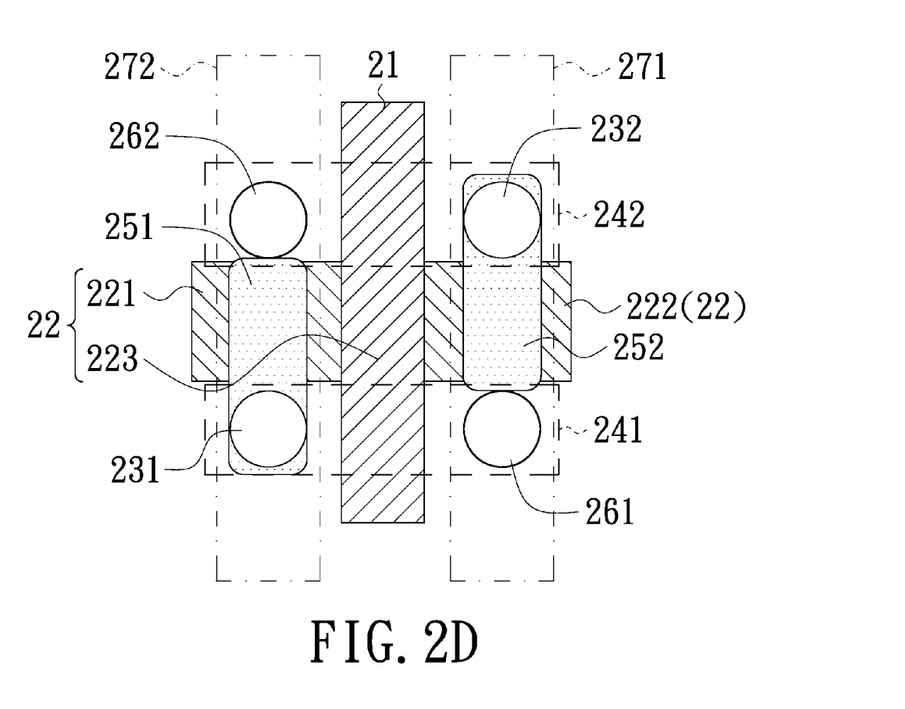

FIG. 2D schematically illustrates a third exemplary circuit layout of another metal-oxide-semiconductor transistor. Through the extension conductor structures 251, 252 and the contact hole structures 231, 232, the extension directions of the metal conductor lines 241 and 242 are adjustable. Moreover, through other contact hole structures 261 and 262, the metal conductor lines 271 and 272 at a higher level may be connected to the metal conductor lines 241 and 242. Under this circumstance, the layout area is minimized.

Figure 3:
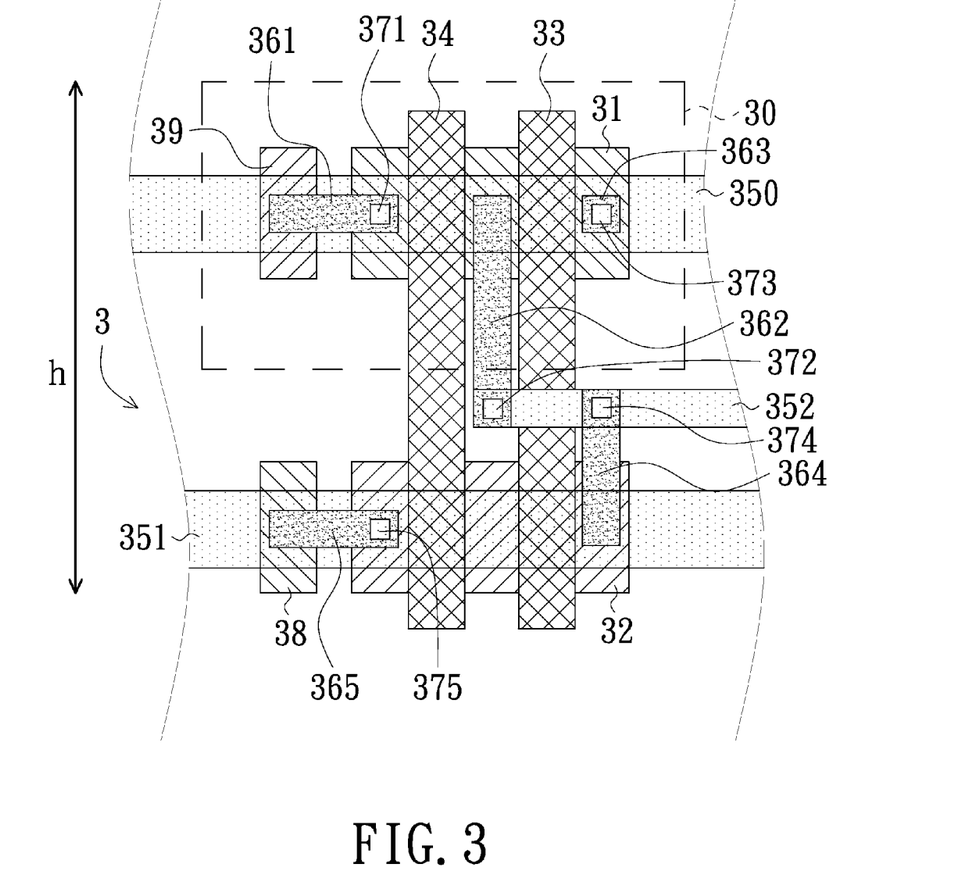
FIG. 3 is a schematic top view illustrating a standard cell of a logic circuit using an extension conductor structures to reduce the layout area according to an embodiment of the present invention.

FIG. 3 is a schematic top view illustrating a standard cell of a logic circuit using an extension conductor structures to reduce the layout area according to an embodiment of the present invention. As shown in FIG. 3, the standard cell is a NAND gate produced by a CMOS manufacturing process. Since the function of the NAND gate of FIG. 3 is similar to that of FIG. 1A, the input terminal and the output terminal are designated by identical numeral references. As shown in FIG. 3, three metal conductor lines 350, 351 and 352 are connected to an operating voltage source VDD, a ground terminal and the output terminal Y, respectively. For reducing the size of the NAND gate, the layout configuration of the NAND gate is adjusted through the extension conductor structures in order to shorten the distance between the metal conductor line 350 and the metal conductor line 351. Consequently, the length h of this standard cell will be decreased.

As shown in FIG. 3, the region circumscribed by a dashed line denotes an N-well region 30. The region outside the N-well region 30 denotes a P-type semiconductor substrate 3. A P-type diffusion region 31 and an N-type body contact region 39 are constructed in the N-well region 30. The P-type diffusion region 31 is shared by the p-channel metal-oxide-semiconductor transistors P1 and P2. In addition, an N-type diffusion region 32 and a P-type body contact region 38 are constructed in the P-type semiconductor substrate 3. The N-type diffusion region 32 is shared by the n-channel metaloxide-semiconductor transistors N1 and N2. Two gate structures 33 and 34 are spanned across the P-type diffusion region 31 and the N-type diffusion region 32 to be respectively served as the input terminals A and B (see FIG. 1A). Moreover, the extension conductor structures 361, 362, 363, 364 and 365 are electrically connected with the contact structures 371, 372, 373, 374 and 375, respectively. Consequently, the P-type diffusion region 31, the N-type body contact region 39, the N-type diffusion region 32 and the P-type body contact region 38 are electrically connected to the metal conductor lines 350, 351 and 352. The extension conductor structure 361 is electrically connected to the P-type diffusion region 31 and the N-type body contact region 39, and further electrically connected to the overlying metal conductor line 350 through the contact structure 371. The extension conductor structure 365 is electrically connected to the P-type body contact region 38 and the N-type diffusion region 32, and further electrically connected to the overlying metal conductor line 351 through the contact structure 375. The extension conductor structure 362 is electrically connected to the P-type diffusion region 31, and further electrically connected to the overlying metal conductor line 352 through the contact structure 372. The extension conductor structure 363 is electrically connected to the P-type diffusion region 31, and further electrically connected to the overlying metal conductor line 350 through the contact structure 373. The extension conductor structure 364 is electrically connected to the N-type diffusion region 32, and further electrically connected to the overlying metal conductor line 352 through the contact structure 374.

The resulting structure of the NAND gate is shown in FIG. 3. Since the metal conductor lines 350 and 351 are closer when compared with the metal conductor lines 150 and 151 in FIG. 1B, the length h of this standard cell will be decreased.

Figure 4A:
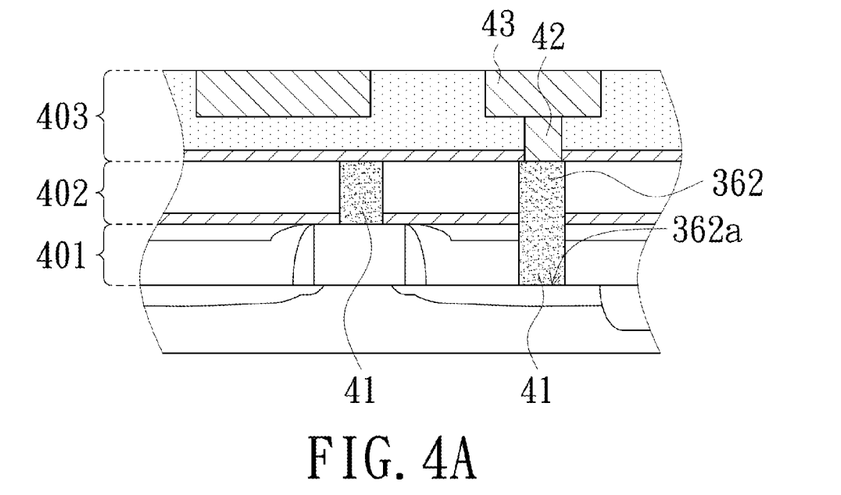
FIG. 4A is a schematic cross-sectional view illustrating a first exemplary relationship between the extension conductor structure and the contact structure of the standard cell as shown in FIG. 3.

FIG. 4A is a schematic cross-sectional view illustrating a first exemplary relationship between the extension conductor structure and the contact structure of the standard cell as shown in FIG. 3. The extension conductor structure is a zero-layer metal structure (M0) 41 that is produced by a general semiconductor manufacturing process. For example, a portion of the zero-layer metal structure 41 made of tungsten or copper may serve as the extension conductor structure 362 having a base 362a directly in contact with a surface of the substrate (see FIG. 4A). In the present embodiment, the base 362a of the extension conductor structure 362 is partially in contact with the common source of the p-channel metal-oxide-semiconductor transistors P1 and P2 that is encompassed in the P-type diffusion region 31 and formed on a surface of the substrate, and a portion of the extension conductor structure 362 extends externally beyond the P-type diffusion region 31 along the surface of the substrate with an extending direction perpendicular to the extending direction from the source region to the drain region of the p-channel metal-oxide-semiconductor transistors P1 and P2, so as to reach a first position overlapped with the overlying metal conductor line 352 (further regarding to FIG. 3). Similarly, the contact structure is a zero-layer contact structure 42 that is produced by a general semiconductor manufacturing process. For example, the zero-layer contact structure 42 is made of tungsten or copper. Each of the metal conductor lines 350, 351 and 352 is implemented by a first-layer metal structure 43. For example, the first-layer metal structure 43 is made of tungsten or copper. The zero-layer metal structure 41 is penetrated through an interlayer dielectric (ILD) layer 401 and a pre-metal dielectric (PMD) layer 402 to be contacted with the zero-layer contact structure 42. Consequently, the zero-layer metal structure 41 is connected with the first-layer metal structure 43 within an inter-metal dielectric (IMD) layer 403 through the zero-layer contact structure 42.

Figure 4B:
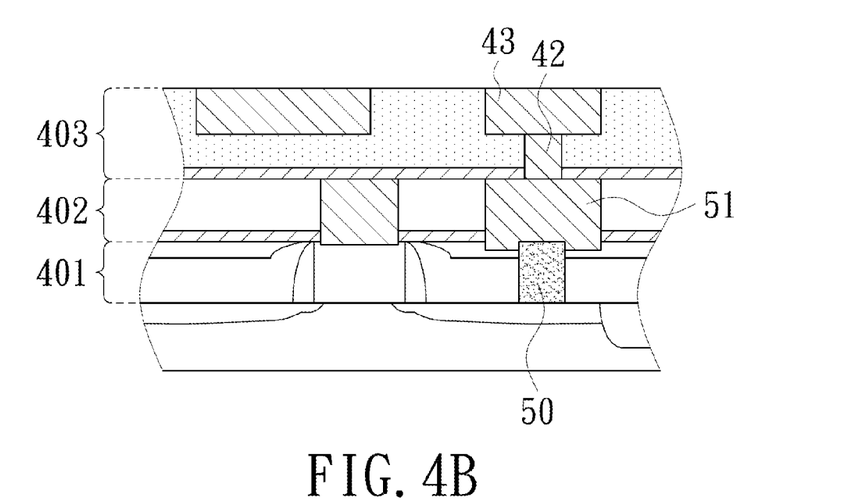
FIG. 4B is a schematic cross-sectional view illustrating a second exemplary relationship between the extension conductor structure and the contact structure of the standard cell as shown in FIG. 3.

FIG. 4B is a schematic cross-sectional view illustrating a second exemplary relationship between the extension conductor structure and the contact structure of the standard cell as shown in FIG. 3. The extension conductor structure comprises a slot contact structure 50 and a zero-layer metal structure (M0) 51 that are produced by a general semiconductor manufacturing process. Similarly, the contact structure is a zero-layer contact structure 42 that is produced by a general semiconductor manufacturing process. Each of the metal conductor lines 350, 351 and 352 is implemented by a first-layer metal structure 43. The slot contact structure 50 is penetrated through an interlayer dielectric (ILD) layer 401 to be contacted with the zero-layer metal structure 51. The zero-layer metal structure 51 is penetrated through a pre-metal dielectric (PMD) layer 402 to be contacted with the zero-layer contact structure 42. Consequently, the zero-layer metal structure 51 is connected with the first-layer metal structure 43 within an inter-metal dielectric (IMD) layer 403 through the zero-layer contact structure 42.

Figure 5:
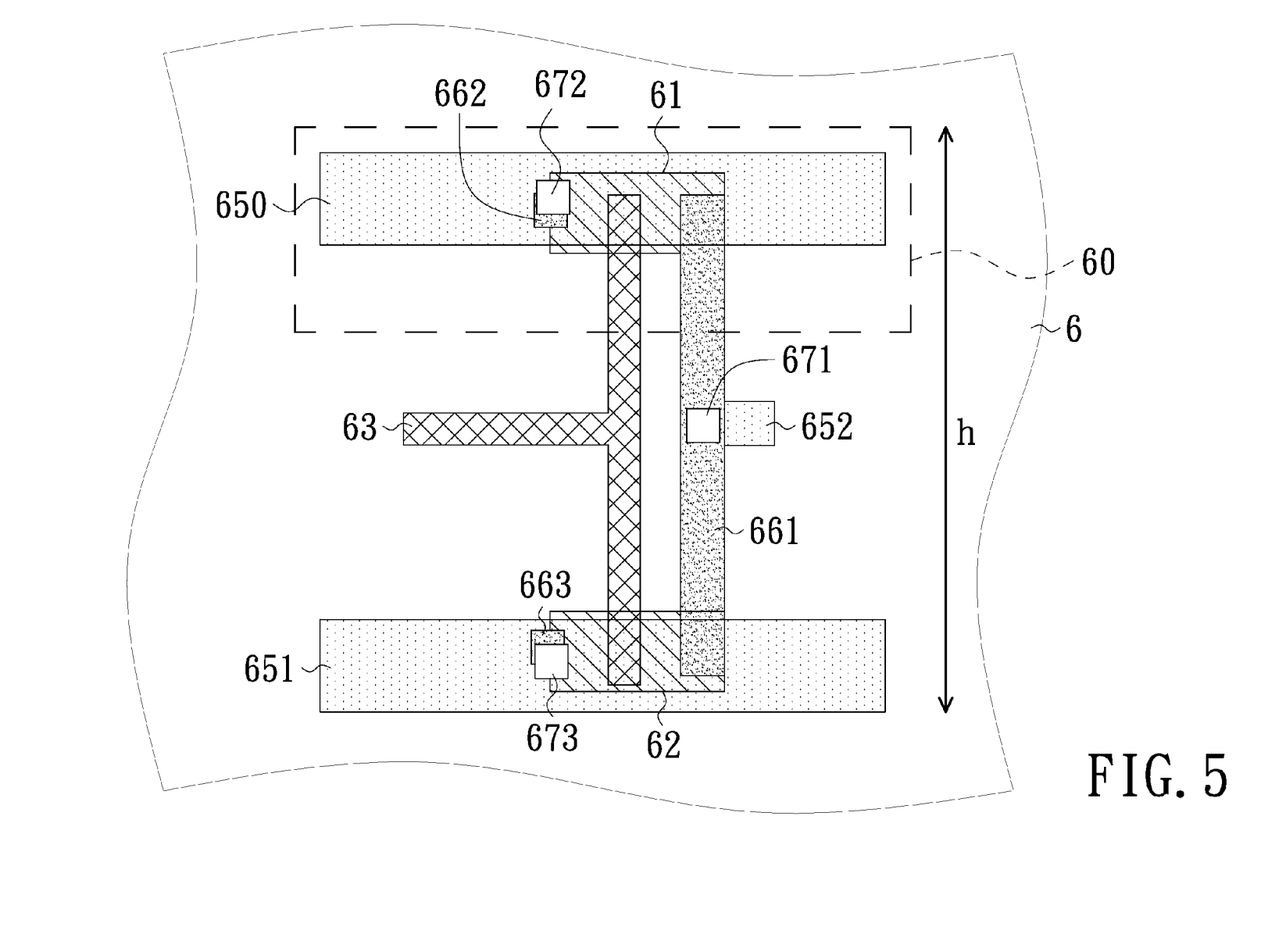
FIG. 5 is a schematic top view illustrating a standard cell of a logic circuit using an extension conductor structures to reduce the layout area according to another embodiment of the present invention.

FIG. 5 is a schematic top view illustrating a standard cell of a logic circuit using an extension conductor structures to reduce the layout area according to another embodiment of the present invention. As shown in FIG. 5, the standard cell is an inverter produced by a CMOS manufacturing process. As shown in FIG. 5, three metal conductor lines 650, 651 and 652 are connected to an operating voltage source VDD, a ground terminal and the output terminal Y, respectively. For reducing the size of the inverter, the layout configuration of the inverter is adjusted through the extension conductor structures in order to shorten the distance between the metal conductor line 650 and the metal conductor line 651. Consequently, the length h of this standard cell will be decreased.

As shown in FIG. 5, the region circumscribed by a dashed line denotes an N-well region 60. The region outside the N-well region 60 denotes a P-type semiconductor substrate 6. A P-type diffusion region 61 of an p-channel metal-oxide-semiconductor transistor is constructed in the N-well region 60. An N-type diffusion region 62 of a n-channel metal-oxide-semiconductor transistor is constructed in the P-type semiconductor substrate 6. A gate structure 63 is spanned across the P-type diffusion region 61 and the N-type diffusion region 62 to be served as an input terminal. Moreover, the extension conductor structures 661, 662 and 663 are electrically connected with the contact structures 671, 672 and 673, respectively. Consequently, the P-type diffusion region 61 and the N-type diffusion region 62 are electrically connected to the metal conductor lines 650, 651 and 652. The resulting structure of the inverter is shown in FIG. 5. Since the metal conductor lines 650 and 651 are closer and spanned across the gate structure 63, the length h of this standard cell will be decreased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. An integrated circuit configuration, comprising:
a substrate;

a diffusion region formed in the substrate, wherein the diffusion region comprises a channel region, a source region and a drain region;

a gate structure formed over the substrate and spanned across the diffusion region;

an extension conductor structure formed over the substrate and contacted with the diffusion region, wherein a portion of the extension conductor structure is directly in contact with a surface of the substrate, and another portion of the extension conductor structure extends externally to a first position along the surface of the substrate, wherein the first position is outside the diffusion region, and an extending direction of the extension conductor structure from the diffusion region to the first position is different from an extending direction from the source region to the drain region;

a dielectric layer formed over the substrate, the gate structure and the extension conductor structure;

a contact structure penetrating through the dielectric layer to be contacted with the first position of the extension conductor structure; and a metal conductor line formed on the dielectric layer and contacted with the contact structure.

2. The integrated circuit configuration according to claim 1, wherein the substrate is a semiconductor substrate.

3. The integrated circuit configuration according to claim 1, wherein the channel region is located under the gate structure.

4. The integrated circuit configuration according to claim 3, wherein the extension conductor structure is in contact with the source region of the diffusion region.

5. The integrated circuit configuration according to claim 4, wherein the extension conductor structure is in contact with the drain region of the diffusion region.

6. The integrated circuit configuration according to claim 1, wherein the extension conductor structure is a zero-layer metal structure.

7. The integrated circuit configuration according to claim 1, wherein the extension conductor structure comprises a slot contact structure and a zero-layer metal structure.

8. The integrated circuit configuration according to claim 1, wherein the contact structure is a zero-layer contact structure.

9. The integrated circuit configuration according to claim 1, wherein the dielectric layer is an inter-metal dielectric layer.

10. The integrated circuit configuration according to claim 1, wherein the metal conductor line is spanned across the gate structure.

* * * * *